United States Patent
Raghunathan et al.

(10) Patent No.: US 12,342,555 B1
(45) Date of Patent: Jun. 24, 2025

(54) BIPOLAR TRANSISTOR

(71) Applicant: GlobalFoundries U.S. Inc., Malta, NY (US)

(72) Inventors: Uppili Srinivasan Raghunathan, Essex Junction, VT (US); Steven M. Shank, Jericho, VT (US); Sarah Ann McTaggart, Essex Junction, VT (US); Megan Elizabeth Lydon-Nuhfer, Essex Junction, VT (US); Cameron Ezera Luce, Colchester, VT (US); Ramsey Hazbun, Colchester, VT (US); Alexander M. Derrickson, Saratoga Springs, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/626,720

(22) Filed: Apr. 4, 2024

(51) Int. Cl.
*H10D 10/80* (2025.01)
*H10D 10/01* (2025.01)
*H10D 62/17* (2025.01)

(52) U.S. Cl.
CPC ......... *H10D 10/821* (2025.01); *H10D 10/021* (2025.01); *H10D 62/177* (2025.01)

(58) Field of Classification Search
None
See application file for complete search history.

(56) References Cited

U.S. PATENT DOCUMENTS

| | | | |
|---|---|---|---|
| 4,966,860 | A | 10/1990 | Suzuki et al. |
| 5,134,454 | A | 7/1992 | Neudeck et al. |
| 2007/0241427 | A1 | 10/2007 | Mochizuki et al. |
| 2021/0091214 | A1* | 3/2021 | Ho ...................... H01L 29/7378 |

FOREIGN PATENT DOCUMENTS

| | | |
|---|---|---|
| CN | 102683400 A | 9/2012 |
| WO | 2013090250 A1 | 6/2013 |

OTHER PUBLICATIONS

John J. Pekarik et al., "A 90nm SiGe BiCMOS Technology for mm-wave and high-performance analog applications", 2014 IEEE Bipolar/BiCMOS Circuits and Technology Meeting (BCTM), Coronado, CA, USA, copyright 2014 (downloaded Oct. 24, 2023), pp. 92-95, doi: 10.1109/BCTM.2014.6981293, 4 pages.

Moonjung Kim et al., "Performance of New Self-Aligned InP/InGaAs HBT's Using Crystallographically Defined Emitter Contact Technology", 2001 International Conference on Indium Phosphide and Related Materials 11:00-12:30 Conference Proceedings, 13th IPRM (Cat. No.01CH37198), Nara, Japan, 2001, pp. 220-223, doi: 10.1109/ICIPRM.2001.929097, 4 pages.

(Continued)

*Primary Examiner* — Joseph C. Nicely
*Assistant Examiner* — Lamont B Koo
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a bipolar transistor and methods of manufacture. The structure includes: a collector region; an extrinsic base comprising an emitter opening with an angled sidewall; an emitter within the emitter opening; and an intrinsic base between the emitter and the collector.

17 Claims, 3 Drawing Sheets

(56) References Cited

OTHER PUBLICATIONS

Panglijen Candra et al., "A 130nm SiGe BiCMOS technology for mm-wave applications featuring HBT with fT/fMAX of 260/320 GHz" 2013 IEEE Radio Frequency Integrated Circuits Symposium (RFIC), Seattle, WA, USA, 2013, pp. 381-384, doi: 10.1109/RFIC. 2013.6569610, 4 pages.
Extended European Search Report and Opinion dated Feb. 12, 2025 for European Application No. EP 24199629.7-1211, 11 pages.
Zhang et al., "Implantation-Free 4H-SiC Bipolar Junction Transistors With Double Base Epilayers", IEEE Electron Device Letters, IEEE Service Center, New York, NY, US, vol. 29, No. 5, May 1, 2008 (May 1, 2008), pp. 471-473, XP011208011, ISSN: 0741-3106 Fig. 1 and par. I I.

\* cited by examiner

BIPOLAR TRANSISTOR

BACKGROUND

The present disclosure relates to semiconductor structures and, more particularly, to a bipolar transistor and methods of manufacture.

A heterojunction bipolar transistor (HBT) is a type of bipolar junction transistor (BJT) which uses differing semiconductor materials for an emitter region and a base region to create a heterojunction. The HBT can handle signals of very high frequencies, up to several hundred GHz. It is commonly used in radio frequency (RF) systems, and in applications requiring a high power efficiency, such as RF power amplifiers in cellular phones.

SUMMARY

In an aspect of the disclosure, a structure comprises: a collector region; an extrinsic base comprising an emitter opening with an angled sidewall; an emitter within the emitter opening; and an intrinsic base between the emitter and the collector.

In an aspect of the disclosure, a structure comprises: a collector region; an intrinsic base region above the collector region; an extrinsic base above the intrinsic base region, the extrinsic base comprising an emitter opening with a vertical sidewall and an angled sidewall; an emitter within the emitter opening; and insulator material on the angled sidewall which isolates the extrinsic base from the emitter.

In an aspect of the disclosure, a method comprises: forming a collector region; forming an extrinsic base with an emitter opening comprising an angled sidewall; forming an emitter within the emitter opening; and forming an intrinsic base between the emitter and the collector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bipolar transistor and methods of manufacture. More specifically, the bipolar transistor comprises a heterojunction bipolar transistor with an angled, faceted emitter-extrinsic base junction. Advantageously, the present disclosure provides improved emitter-base scaling with a corresponding reduction in base resistance and improvement in Fmax. The present disclosure also eliminates the need for a non-self-aligned mask level and provides a single reduced-pass deposition of intrinsic and extrinsic bases.

In more specific embodiments, the bipolar transistor comprises a vertical heterojunction bipolar transistor (HBT). The heterojunction bipolar transistor comprises an intrinsic base, extrinsic base, an emitter, and a collector. As should be understood by those of skill in the art, the extrinsic base facilitates the flow of base current into the intrinsic base by allowing a least resistive pathway within a monocrystalline region. The extrinsic base comprises a single crystalline semiconductor material, e.g., monocrystalline semiconductor material. In embodiments, the single crystalline semiconductor material includes an emitter opening comprising a vertical sidewall and an angled sidewall, e.g., along a crystallographic plane facet of the monocrystalline semiconductor material. The angled sidewall starts within the extrinsic base layer and terminates at bottom of the extrinsic base layer (at an etch stop material). A junction or interface is provided between the extrinsic base and the emitter at the angled sidewall, separated by a sidewall spacer.

The bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistor of the present disclosure have been adopted from integrated circuit (IC) technology. For example, the structures are built on wafers and are realized in films of material patterned by photolithographic processes on the top of a wafer. In particular, the fabrication of the bipolar transistor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
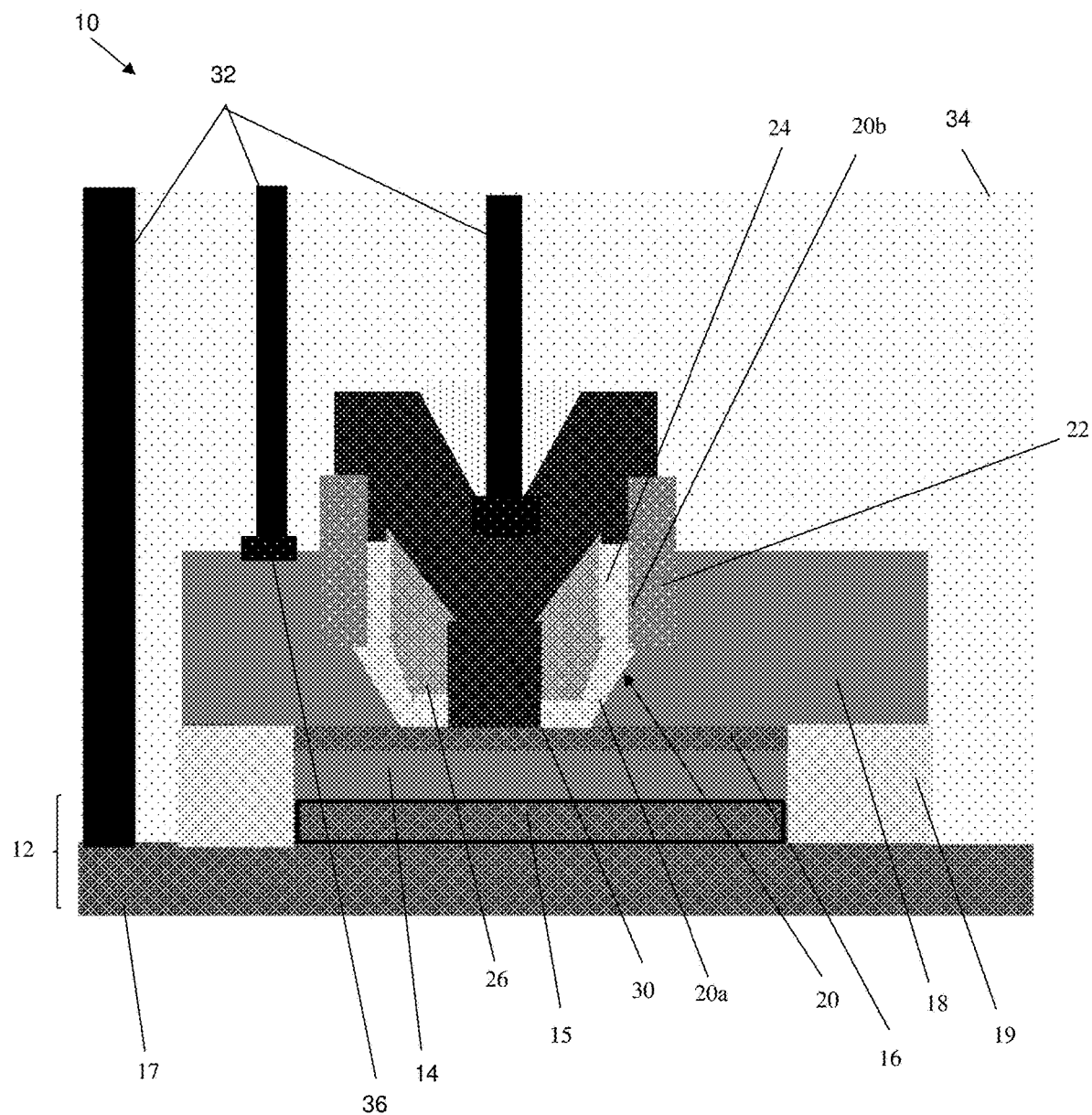
FIG. 1 shows a device and respective fabrication processes in accordance with aspects of the present disclosure.

FIG. 1 shows a device and respective fabrication processes in accordance with aspects of the present disclosure. More specifically, the device 10 of FIG. 1 includes a vertical heterojunction bipolar transistor comprising an emitter (e.g., emitter material 30), an extrinsic base (e.g., semiconductor material 18) and a collector region (e.g., comprising semiconductor substrate 12). The extrinsic base 18 includes an angled sidewall 20a which forms at a junction between the extrinsic base 18 and the emitter 30. One or more sidewall spacers 24, 26 may be provided at the junction between the extrinsic base 18 and the emitter 30. The angled sidewall extends along an angled crystal plane facet of the single crystalline semiconductor material of the extrinsic base 18.

In embodiments, the semiconductor substrate 12, which acts as a collector region 15 of the device 10, may be composed of any suitable material including, but not limited to, Si, SiGe, SiGeC, SiC, GaAs, InAs, InP, and other III/V or II/VI compound semiconductors. In embodiments, the semiconductor substrate 12 may form the collector region 15 and the sub-collector region 17, below the collector region 15.

A semiconductor material 14 may be provided on the semiconductor substrate 12. The semiconductor material 14 may act as an intrinsic base of the device 10, which is above the collector region 15. The semiconductor material 14 may be epitaxially grown on the semiconductor substrate 12. In embodiments, the semiconductor substrate 12 comprises Si and the semiconductor material 14 comprises SiGe, both of which preferably comprise any suitable single crystallographic orientation (e.g., a <100>, <110>, <111>, or <001> crystallographic orientation).

A dielectric material 19 may bound the intrinsic base 14 and the collector region 15 of the device 10. In embodiments, the dielectric material 19 may be aligned with an outer edge of the extrinsic base 18. Also, the extrinsic base 18 may be separated from the sub-collector region 17 by the dielectric material 19.

FIG. 1 further shows an etch stop layer 16 provided on the semiconductor material 14. In embodiments, the etch stop layer 16 may be epitaxially grown on the semiconductor material 14. The semiconductor material 18 may be provided on the etch stop layer 16. In embodiments, the semiconductor material 18 may be an extrinsic base for the device 10, which is semiconductor material epitaxially grown on the etch stop layer 16. In embodiments, the extrinsic base 18 extends laterally past the etch stop layer 16.

In preferred embodiments, the semiconductor material 18 comprises any suitable single crystallographic orientation (e.g., a <100>, <110>, <111>, or <001> crystallographic orientation). That is, the semiconductor material 18 is monocrystalline semiconductor material. Also, in preferred embodiments, the semiconductor material 18 is different semiconductor material than the etch stop layer 16. For example, the semiconductor material 18 comprises SiGe material and the etch stop layer 16 comprises Si material. In this way, a trench (e.g., emitter opening) 20 with a faceted or angled sidewall 20a can be selectively etched into the semiconductor material 18 without the need for an additional photolithographic mask.

In more specific embodiments, the emitter opening 20 includes a vertical sidewall 20b defined by sidewall spacers 22 at an upper portion of the semiconductor material 18, in addition to an angled sidewall 20a starting within the extrinsic base (e.g., semiconductor material 18) and terminating at a bottom of the extrinsic base (e.g., semiconductor material 18) at the etch stop layer 16. The angled sidewall 20a follows a facet along a crystallographic plane of the semiconductor material 18, e.g., at an angle along the facet of the monocrystalline structure.

Sidewalls spacers 24, 26 are provided on the vertical sidewall 20b, e.g., over the spacer 22, and the faceted or angled sidewall 20a. As to the latter feature, the spacers 24, 26 will be angled along the crystal plane of the semiconductor material 18. The thickness of the spacers 24, 26 may be adjusted to improve scaling, reduce base resistance and improve Fmax.

Although multiple sidewall spacers 24, 26 are shown, it should be understood by those of skill in the art that one sidewall spacer may also be contemplated by the present disclosure. In one illustrative embodiment, the sidewall spacer 22 may be a nitride material and the sidewall spacer(s) 24, 26 may be an oxynitride spacer (e.g., selective to HCl etch and can endpoint on an oxide spacer). In an example, the sidewall spacer 24 may be oxide and the sidewall spacer 26 may be nitride.

In embodiments, the spacer(s) 24, 26 are symmetric about the emitter opening 20. Moreover, in embodiments, the angled spacer 24 (e.g., oxide spacer) isolates the spacer 26 (e.g., angled nitride spacer) from the etch stop layer 16. This arrangement the emitter 30 will not directly touch spacer 26 at the etch stop layer 16 (e.g., lowly doped region), thereby preventing leakage issues.

FIG. 1 further shows an emitter 30 extending into and outside of the trench (e.g., emitter opening) 20. More specifically, the emitter 30 may be provided entirely within the emitter opening 20 on the sidewall spacers 26 along the vertical sidewall 20b and faceted or angled sidewall 20a. The emitter 30 may also extend to and contact the etch stop layer 16. In addition, the spacer 24 meets the emitter 30 at the junction between the emitter 30 and the etch stop layer 16. The emitter 30 at the faceted or angled sidewall 20a will form an angled (faceted) emitter-extrinsic base junction of the heterojunction bipolar transistor.

In embodiments, the emitter 30 may be polysilicon material deposited by conventional deposition processes, e.g., CVD process, followed by a patterning process as is known in the art such that no further explanation is required for a complete understanding of the present disclosure. The emitter 30 may be a "Y" shape with its upper legs extending over and in contact with a top surface of the spacer 22. Moreover, in embodiments, depending on the thickness of the extrinsic base 18 and the emitter 30, the emitter shape can be a broad V-shape (if the base is thin), a pointed V-shape (if the base is thick and the emitter is thin) or a Y-shape (if the emitter film is very thick). Accordingly, in the illustration of FIG. 1, for example, the emitter is thick (plugged at the bottom) so the shape is Y-shaped.

Contacts 32 may extend to the emitter 30, the extrinsic base 18 and the collector 15 (by contacting to the sub-collector region 17 formed in the semiconductor substrate 12). The contacts to the sub-collector region 17 may be isolated (e.g., electrically insulated) from the intrinsic base 14 by the dielectric material 19. The contacts 32 may be formed in interlevel dielectric material 34 by forming trenches to the emitter 30, the extrinsic base 18 and the collector (e.g., semiconductor substrate 12), followed by a deposition of metal or metal alloy. The interlevel dielectric material 34 may be oxide or nitride or combinations thereof. The metal or metal alloy of the contacts 32 may be tungsten, aluminum, copper or other known conductive materials. The contacts 32 can be lined with TaN or TiN. The contacts 32 may be formed by a conventional deposition process, e.g., CVD, followed by a chemical mechanical planarization (CMP) to remove any excess material from a top surface of the interlevel dielectric material 34.

Prior to forming the contacts, silicide contacts 36 may be provided on the emitter 30 and the extrinsic base 18. As should be understood by those of skill in the art, the silicide process begins with deposition of a thin transition metal layer, e.g., nickel, cobalt or titanium, over fully formed and patterned semiconductor devices (e.g., emitter 30 and the extrinsic base 18). After deposition of the material, the structure is heated allowing the transition metal to react with exposed silicon (or other semiconductor material as described herein) in the active regions of the semiconductor device (e.g., emitter 30 and the extrinsic base 18) forming a low-resistance transition metal silicide contacts 36.

FIGS. 2A-2D show respective fabrication processes for manufacturing the device of FIG. 1 in accordance with aspects of the present disclosure. It should be understood by those of skill in the art that the fabrication processes of FIGS. 2A-2D depict an enlarged view (e.g., zoomed-in view of the device in FIG. 1). For example, for simplicity, the stack (e.g., epitaxial stack of materials) comprising the collector 17, intrinsic base 14 and extrinsic base 18 are shown.

Figure 2A:
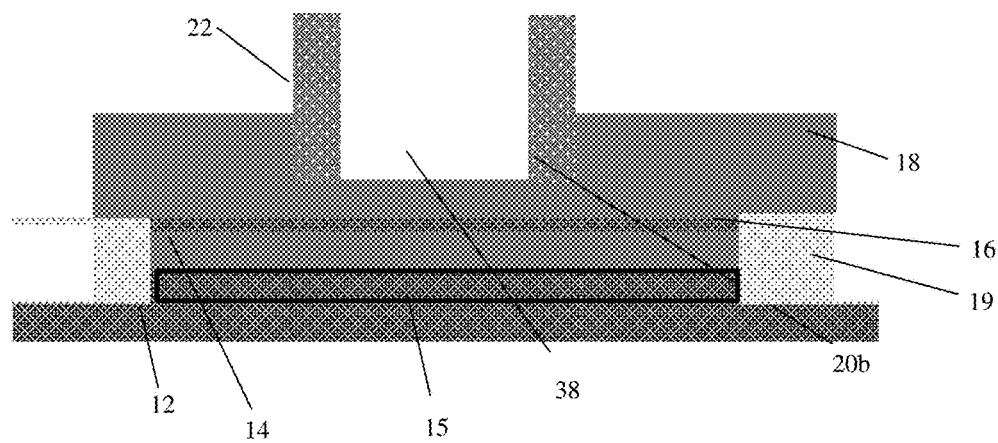
FIGS. 2A-2D show respective fabrication processes for manufacturing the device of FIG. 1 in accordance with aspects of the present disclosure.

FIG. 2A shows the semiconductor substrate 12, the semiconductor material 14, the etch stop layer 16 and the semiconductor material 18. The semiconductor material 14 may be epitaxially grown on the semiconductor substrate 12, with the etch stop layer 16 epitaxially grown on the semiconductor material 14 and the semiconductor material 18 epitaxially grown on the etch stop layer 16. As already described herein the semiconductor material 18 may be monocrystalline SiGe and the etch stop layer 16 may be Si.

Examples of various epitaxial growth processes that can be employed in the present disclosure include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth can be performed utilizing any well-known precursor gas or gas mixture. Carrier gases like hydrogen, nitrogen, helium and argon can be used. An n-type or p-type dopant may also be added to the precursor gas or gas mixture.

The spacers 22 are formed using conventional lithography, etching and deposition processes. For example, a resist formed over the semiconductor material 18 is exposed to energy (light) and developed utilizing a conventional resist developer to form a pattern (opening). An etching process with a selective chemistry, e.g., reactive ion etching (RIE), will be used to transfer the pattern to the semiconductor material 18 to form one or more trenches in the semiconductor material 18. The insulator material, e.g., nitride, may be deposited within the trench to form the spacers 22. The insulator material may be deposited using a conventional deposition process, e.g., CVD. Prior to the deposition process, the resist may be removed by a conventional oxygen ashing process or other known stripants.

Thereafter, through a timed-etching process, a trench 38 may be formed partially within the semiconductor material 18. In this way, the vertical sidewalls 20*b* will be defined by the spacer 22. This etching process may be used without any additional lithography steps may be used to expose the etch stop layer 16. A lithography and etching process may also be used to remove portions of the collector region 15, extrinsic base 18 and dielectric material 19 to expose regions of semiconductor material 12 for subsequent formation of the contacts to the collector.

A dielectric material 19 may also be provided under the extrinsic base 18. In embodiments, the dielectric material 19 may be an oxide material, for example, with its outer edge aligned with an outer edge of the extrinsic base 18. The dielectric material 19 may also bound the intrinsic base 14, e.g., isolate the intrinsic base 14. The dielectric material 19 may be formed by conventional lithography, etching (RIE) and deposition processes, e.g., CVD, as is known in the art such that no further explanation is required for a complete understanding of the present disclosure.

Figure 2B:
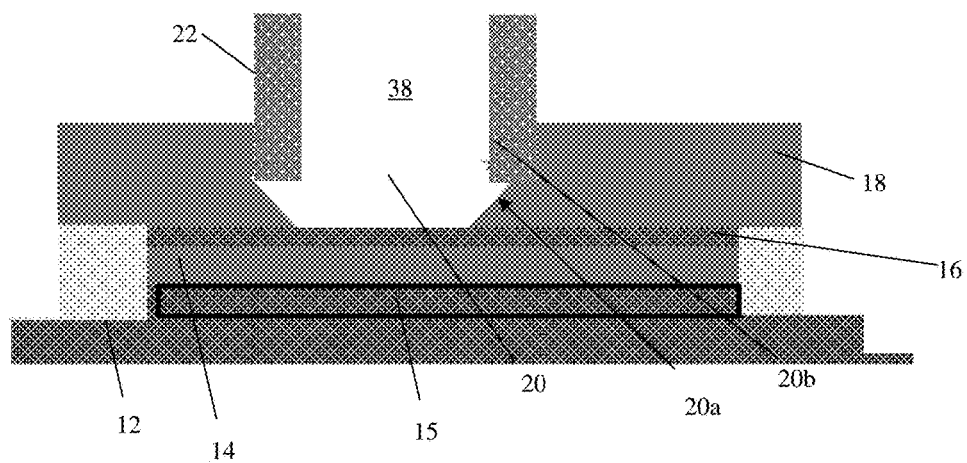

In FIG. 2B, the semiconductor material 18 may be selectively etched through the trench 38 to form the angled sidewall 20*a* of the emitter opening 20. As the semiconductor material 18 is a monocrystalline material, the etching process will follow the facets of the semiconductor material 18 to form the angled sidewall 20*a*, e.g., an angled facet along a crystallographic plane of the semiconductor material 18. The selective etching process is selective to the semiconductor material 18 and will stop at the etch stop layer 16. In embodiments, the etchant can be a dry etch with etchant chemistry of, for example, hot ammonia ($NH_3$) and/or hydrochloric acid (HCl) vapor.

Figure 2C:
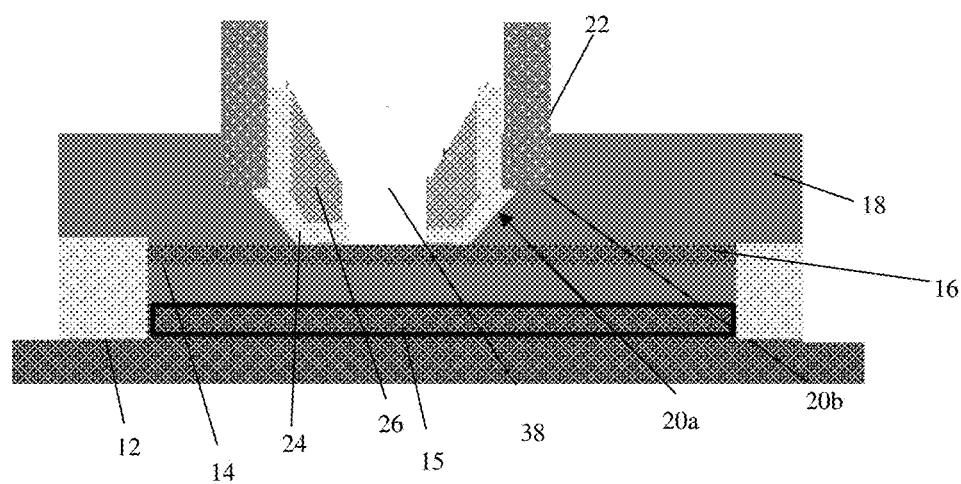

In FIG. 2C, the sidewall spacers 24, 26 are formed over the vertical sidewalls 20*b* of the spacers 22 and the angled sidewall 20*a* of the emitter opening 20. In embodiments, the sidewall spacers 24, 26 may be formed by conventional deposition processes, e.g., CVD, followed by an anisotropic etching process to remove the insulator material, e.g., oxide and nitride, from horizontal surfaces of the semiconductor material 18 and exposed portions of the etch stop layer 16. The nitride material of the spacers 22 may also be removed by known anisotropic etching processes. The deposition process of the sidewall spacers 24, 26 may be tuned so as to provide or adjust a desired thickness at the angled sidewall 20*a*. In this way, the emitter 30 can be closer to the extrinsic base 18 thereby improving scaling, reducing base resistance and improving Fmax.

Figure 2D:
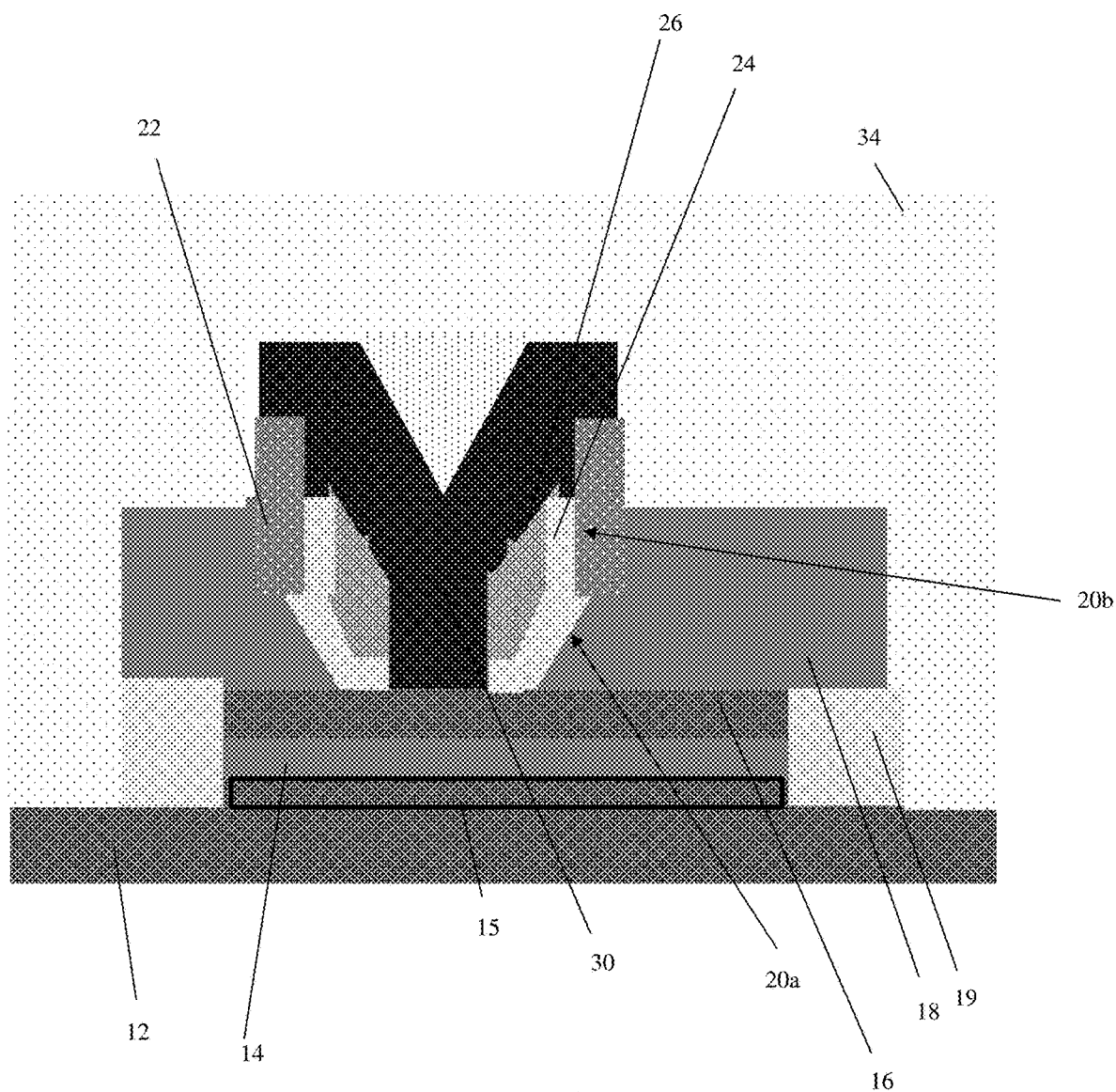

FIG. 2D shows the formation of the emitter 30 and the interlevel dielectric material 34. In embodiments, the emitter 30 may be formed by conventional CVD processes within the emitter opening 20, followed by a patterning process. The interlevel dielectric material 34 may also be deposited by a conventional deposition process, e.g., CVD process. FIG. 1 shows the back-end-of-the-line (BEOL) processes to form the contacts 32 and silicide contacts 36.

The bipolar transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a collector region;
an extrinsic base comprising an emitter opening with an angled sidewall;
an emitter within the emitter opening; and
an intrinsic base between the emitter and the collector,
wherein the extrinsic base comprises a single crystalline semiconductor material and the angled sidewall extends along an angled crystal plane facet of the single crystalline semiconductor material of the extrinsic base.

2. The structure of claim 1, wherein the single crystalline semiconductor material comprises SiGe.

3. The structure of claim 1, wherein the angled sidewall terminates at a material that is selective to the extrinsic base.

4. A structure comprising:
a collector region;
an extrinsic base comprising an emitter opening with an angled sidewall;
an emitter within the emitter opening; and
an intrinsic base between the emitter and the collector,
wherein the extrinsic base comprises a single crystalline semiconductor material and the emitter is within the emitter opening extending into the extrinsic base, with the emitter opening comprising the angled sidewall and a vertical sidewall above the angled sidewall.

5. The structure of claim 4, wherein the vertical sidewall comprises a sidewall spacer material.

6. The structure of claim 5, further comprising insulator material on the angled sidewall of the extrinsic base.

7. The structure of claim 6, wherein the insulator material comprises oxide material and nitride material extending over the sidewall spacer material.

8. The structure of claim 6, wherein the insulator material is symmetrical within an opening of the extrinsic base.

9. The structure of claim 5, wherein the emitter extends over an upper surface of the sidewall spacer material.

10. A structure comprises:
a collector region;
an intrinsic base region above the collector region;
an extrinsic base above the intrinsic base region, the extrinsic base comprising an emitter opening with a vertical sidewall and an angled sidewall;
an emitter within the emitter opening; and
insulator material on the angled sidewall which isolates the extrinsic base from the emitter,
wherein the extrinsic base comprises a single crystalline semiconductor material and the angled sidewall extends along an angled crystal plane facet of the single crystalline semiconductor material.

11. The structure of claim 10, wherein the vertical sidewall comprises a sidewall spacer material and the angled sidewall is covered with the insulator material.

12. The structure of claim 10, wherein the angled sidewall terminates at a semiconductor material that is selective to the extrinsic base.

13. The structure of claim 10, wherein the sidewall spacer material is angled and borders at a junction between the extrinsic base and the emitter.

14. A structure comprises:
a collector region;
an intrinsic base region above the collector region;
an extrinsic base above the intrinsic base region, the extrinsic base comprising an emitter opening with a vertical sidewall and an angled sidewall;
an emitter within the emitter opening; and
insulator material on the angled sidewall which isolates the extrinsic base from the emitter,
wherein the vertical sidewall comprises a sidewall spacer material and the angled sidewall is covered with the insulator material and the sidewall spacer material comprises oxide material and nitride material over the oxide material, the oxide material extending to underneath the nitride material.

15. A structure comprises:
a collector region;
an intrinsic base region above the collector region;
an extrinsic base above the intrinsic base region, the extrinsic base comprising an emitter opening with a vertical sidewall and an angled sidewall;
an emitter within the emitter opening; and
insulator material on the angled sidewall which isolates the extrinsic base from the emitter,
wherein the vertical sidewall comprises a sidewall spacer material and the angled sidewall is covered with the insulator material and the sidewall spacer material is symmetrical within the emitter opening.

16. A structure comprises:
a collector region;
an intrinsic base region above the collector region;
an extrinsic base above the intrinsic base region, the extrinsic base comprising an emitter opening with a vertical sidewall and an angled sidewall;
an emitter within the emitter opening; and
insulator material on the angled sidewall which isolates the extrinsic base from the emitter,
wherein the vertical sidewall comprises a sidewall spacer material and the angled sidewall is covered with the insulator material and the sidewall emitter extends over an upper surface of the sidewall spacer material.

17. A method comprising:
forming a collector region;
forming an extrinsic base with an emitter opening comprising an angled sidewall;
forming an emitter within the emitter opening; and
forming an intrinsic base between the emitter and the collector,
wherein the extrinsic base comprises a single crystalline semiconductor material and the angled sidewall extends along an angled crystal plane facet of the single crystalline semiconductor material of the extrinsic base.

* * * * *